(12) United States Patent
Jagt et al.

(10) Patent No.: US 8,283,686 B2
(45) Date of Patent: Oct. 9, 2012

(54) SIDE EMITTING DEVICE WITH HYBRID TOP REFLECTOR

(75) Inventors: Hendrik Johannes Boudewijn Jagt, Eindhoven (NL); Mihaela-ioana Popovici, Leuven (BE); Christian Kleynen, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 194 days.

(21) Appl. No.: 12/746,773

(22) PCT Filed: Dec. 3, 2008

(86) PCT No.: PCT/IB2008/055063
§ 371 (c)(1),
(2), (4) Date: Jun. 8, 2010

(87) PCT Pub. No.: WO2009/074919
PCT Pub. Date: Jun. 18, 2009

(65) Prior Publication Data
US 2010/0258831 A1    Oct. 14, 2010

(30) Foreign Application Priority Data
Dec. 11, 2007    (EP) .................................. 07122839

(51) Int. Cl.
*H01L 33/00*    (2010.01)
(52) U.S. Cl. ...... 257/98; 257/99; 257/100; 257/E33.061
(58) Field of Classification Search ............... 257/98, 257/99, 100, E33.061
See application file for complete search history.

(56) References Cited

U.S. PATENT DOCUMENTS

| 5,537,433 | A | 7/1996 | Watanabe |
| 6,066,861 | A | 5/2000 | Hohn et al. |
| 7,285,802 | B2 | 10/2007 | Ouderkirk et al. |
| 7,378,686 | B2 * | 5/2008 | Beeson et al. ................ 257/100 |
| 2004/0145308 | A1 | 7/2004 | Rossner et al. |
| 2005/0145867 | A1 | 7/2005 | Yau et al. |
| 2005/0269582 | A1 | 12/2005 | Mueller et al. |
| 2006/0092663 | A1 | 5/2006 | Noh et al. |
| 2006/0208269 | A1 | 9/2006 | Kim et al. |
| 2006/0273337 | A1 | 12/2006 | Han et al. |
| 2007/0001187 | A1 | 1/2007 | Kim |
| 2007/0047228 | A1 | 3/2007 | Thompson et al. |
| 2007/0086211 | A1 | 4/2007 | Beeson et al. |
| 2007/0138494 | A1 | 6/2007 | Pugh et al. |
| 2007/0170454 | A1 | 7/2007 | Andrews |
| 2007/0182299 | A1 | 8/2007 | Ouderkirk et al. |
| 2008/0074888 | A1 | 3/2008 | Chang |

FOREIGN PATENT DOCUMENTS

| EP | 1204151 A1 | 5/2002 |
| EP | 1503434 A1 | 2/2005 |
| WO | 2004097949 | 11/2004 |
| WO | 2007047437 A2 | 4/2007 |

* cited by examiner

*Primary Examiner* — Tan N Tran
(74) *Attorney, Agent, or Firm* — Mark L. Beloborodov

(57) ABSTRACT

A side-emitting light emitting device (100) is provided, comprising at least one light emitting diode (101) arranged on a substrate (102) and facing a scattering reflector (103, 109) disposed at a distance from and extending along the extension of said substrate. The scattering reflector comprises scattering components (110) distributed in a carrier (108), and the scattering components have a refractive index being different from the refractive index of said carrier. The scattering action of the reflector gives rise to an angular redistribution in the device, which increases the chance of light exiting the device through lateral openings between the reflector and the substrate, while light is essentially prevented from being emitted through the top surface.

12 Claims, 1 Drawing Sheet

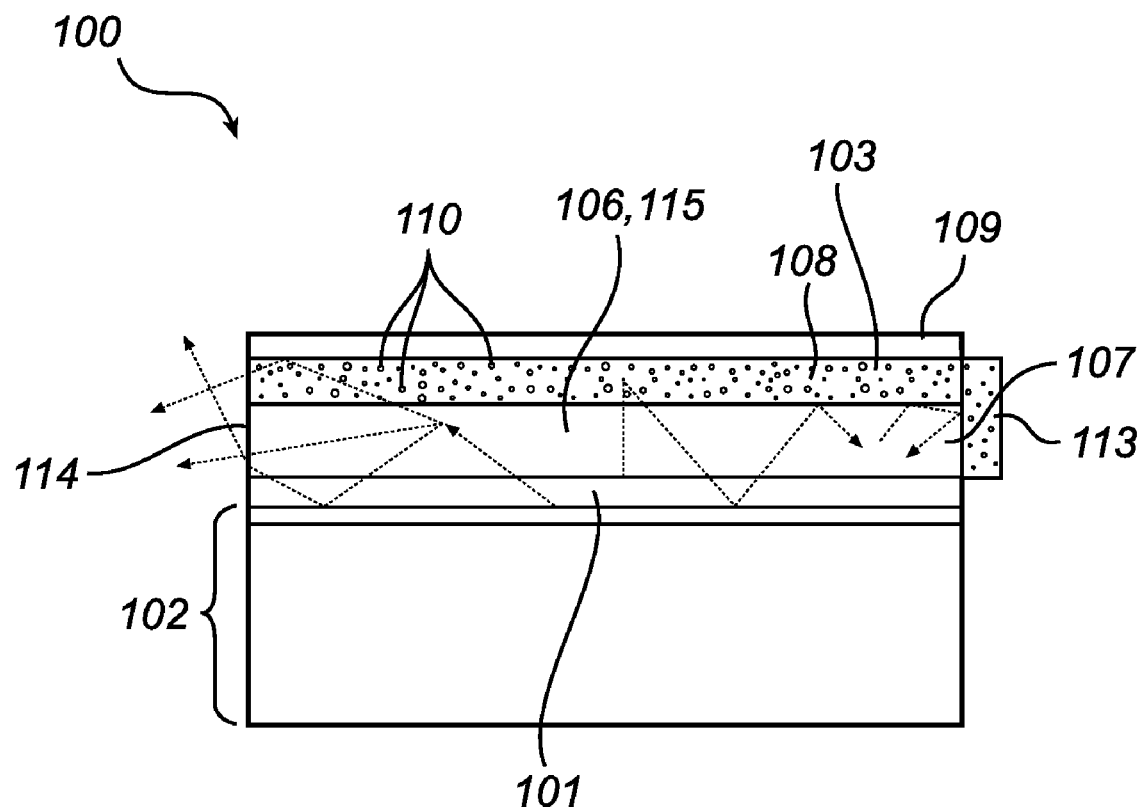

SIDE EMITTING DEVICE WITH HYBRID TOP REFLECTOR

FIELD OF THE INVENTION

The present invention relates to a side-emitting light emitting device comprising at least one light emitting diode arranged on a substrate and facing a scattering reflector disposed at a distance from and extending along the extension of said substrate.

BACKGROUND OF THE INVENTION

Colored LEDs as well as phosphor converted high power LEDs are attractive for use in large backlight panels as efficient high-brightness light sources. However, in certain applications, such as thin backlights for handheld display devices, such as mobile phones, PDAs and the like, it is desired to use thin side emitting light emitting devices as light sources.

A side emitting light emitting device is described in US 2006/0208269 A1, Kim et al, which describes a light emitting diode arranged on a substrate and under a reflective surface which is designed such that light from the light emitting diode is reflected towards the sides of the device by means of total internal reflection. Behind the reflective surface, on the opposite side from the LED, is arranged a scattering material in order to scatter and reflect back through the reflective surface light that has passed through the reflective surface, i.e. light not subject to total internal reflection on the reflective surface.

However, in order for the above device to work properly, the reflective surface must be slanted so that light coming from beneath is reflected to the sides by means of total internal reflection. Hence, the distance from the substrate to the reflecting surface must increase gradually towards the sides. This adds to the total thickness of the device. Further, in order to prevent light from leaving the scattering material through the top surface, the scattering material needs to have a substantial thickness, which also might add to the total thickness of the device.

SUMMARY OF THE INVENTION

It is an object of the present invention to at least partly overcome this problem, and to provide a side-emitting device that easily can be manufactured having a low thickness.

With low thickness comes that the heat dissipated by the LED will be able to affect the whole device. Especially, when using high-power LEDs, the thermal load will be significant on the components of the device. Hence, a further object of the present invention is to provide a side-emitting light emitting device which can withstand operating temperatures for extended time periods of use.

Hence, in a first aspect the present invention provides a side emitting light emitting device comprising at least one light emitting diode arranged on a substrate and facing a scattering reflector disposed at a distance from and extending along the extension of said substrate, wherein said reflector comprises scattering components distributed in a carrier, the scattering components having a refractive index being different from the refractive index of said carrier.

For example, the scattering components may be solid particles having a refractive index higher or lower, preferably higher, than that of the carrier, or may alternatively be pores having a refractive index lower than that of the carrier.

Light emitted by the LED is incident on the reflector, and independent on the angle of incidence it will be scattered and reflected. Due to the scattering properties of the reflector no substantial amount of light will exit the device through the reflector and hence, the major part of light exiting the device must do so at the opening between the substrate and the reflector.

The scattering action gives rise to an angular redistribution in the device, which increases the chance of light exiting the device at all. Hence, a scattering reflector will increase the light extraction over a specular reflector.

The scattering particles are typically of an inorganic material, such as a metal oxide, which is thermally stable and photo-stable.

The carrier of the scattering reflector may for example be a silicon-comprising network, typically a silicate network, for example an alkylsilicate network, or polysiloxane network. A reflector based on a silicon-comprising network is fully or essentially inorganic and does hence have a low susceptibility to heat degradation and photo degradation. Additionally, it is easy to apply on a solid substrate.

Alternatively, the carrier of the scattering reflector is a ceramic material. Ceramic materials are typically photo-stable and thermally stable, and are thus well suited for this purpose.

In embodiments of the present invention, a top reflector may be arranged on top of said scattering reflector.

Typically, such top reflector is essentially opaque. Hence, the scattering component of the reflector can be made just thick enough to achieve the desired scattering action. When a top reflector is arranged on top of the scattering reflector, the light encountering the top reflector will pass through the scattering reflector twice. By this, the thickness of the scattering layer can be drastically reduced in comparison to a scattering layer without the reflector on top in obtaining the same degree of scattering. This helps to reduce the total thickness of the device.

In embodiments of the present invention, a solid transmissive material may be arranged between the substrate and the reflector.

A solid transmissive material can result in a more efficient light extraction from the LED as less light is reflected from the high refractive index LED material to a higher index solid layer that to for example, air. In addition, the critical angle of total internal reflection at the interface of the LED is increased by a solid body, increasing the light extraction from the LED.

In embodiments of the present invention, the transmissive material may comprise a wavelength converting material.

When a wavelength converting material is arranged between the substrate and the reflector, the light emitted by the LED will be subject to wavelength conversion, and the color of the light output can be tailored to the need of the user, without increasing the size of the device or adding external elements to the device. In addition, the wavelength converting material may have a scattering effect on the light, increasing the advantages of scattering in the device.

In embodiments of the present invention, especially embodiments where no top reflector is present, the scattering reflector may comprise a pigment, or a pigmented layer may be arranged on top of said scattering reflector.

The pigment can be used to tune the color of light escaping through the scattering reflector or reflecting from the reflector, or to dim the light escaping through the scattering reflector. Additionally the pigment gives the device a tunable visual appearance such as a desirable color when the LED is turned off.

In embodiments of the present invention the scattering reflector may be arranged essentially parallel to said substrate. Due to the scattering effect of the reflector, a large portion of the light emitted by the LED will exit through the opening(s) between the substrate and the reflector, even if the reflector is parallel to the substrate. Hence, a device of the present invention may be made thin.

In embodiments of the present invention, part of the lateral edges of the solid transmissive material may be coated by a reflective coating. Hence, the emitted light may be directed in one or more selected directions.

BRIEF DESCRIPTION OF THE DRAWING

This and other aspects of the present invention will now be described in more detail with reference to the appended drawing showing a currently preferred embodiment of the invention.

FIG. 1 illustrates schematically in cross-sectional view, one embodiment of a device of the present invention.

DETAILED DESCRIPTION

A first embodiment of a side emitting light emitting device 100 of the present invention is schematically illustrated in FIG. 1 and comprises a light emitting diode, herein also denoted "LED" 101 and a substrate 102 on which the LED 101 is arranged. Not shown in this drawing, but also present in the device as conventional in the art is driving circuitry for the LED. A reflector 103 is arranged above the surface of the substrate 102 that the LED 101 is arranged. Hence, the LED 101 faces the reflector 103.

In this embodiment, the substrate 102 and the scattering reflector 103 are illustrated as being essentially parallel, but as will follow from the description below, this is not necessary for all embodiments of the invention.

The substrate 102 and the reflector 103 form a lower and upper limit, respectively, for a light propagation region 115 disposed there between. The light propagation region 115 may be empty (vacuum), filled with a gas, liquid, gel, or with a solid transmissive material 106 for the light emitted by the LED to propagate within.

The device has at least one lateral opening 114 at least one lateral edge of the light propagation 115, and between the substrate and the reflector, through which opening(s) light emitted by the LED 101 and propagating in the light propagation region 115 may exit the device 100.

The light emitting diode 101 is arranged on the substrate 102. The light from the LED 101 typically has a substantial angular spread, such as emission in a half sphere pattern or lower spread, and has typically a main direction of light emission which is perpendicular from the surface of the substrate, a so called top emissive LED. However, other types of LEDs may also be used in a device of the present invention.

As used in this application, the term "light emitting diode" herein abbreviated "LED" refers to any type of light emitting diode or laser emitting diode known to those skilled in the art, including, but not limited to inorganic based LEDs, small organic molecule based LEDs (smOLEDs) and polymeric based LEDs (polyLEDs). In addition, photonic bandgap LEDs may also be used, which emits light in a narrower and tunable light cone. The light emitted by an LED suitable for use in the present invention is typically within the wavelength range of from UV light to visible light. For visible light, the emission may be of any color, from violet to red. Typically, blue light emitting LEDs are used in devices of the present invention.

The substrate 102 is a support for the LED 101 and may be of a multi layer structure. Typically, the substrate 102 comprises a layer that is reflective to the light emitted by the LED. The reflective layer may be a reflective backplane of the LED 101, which combines an electrode function with the reflective function, or may be a separate layer. The reflective layer typically comprises a metal, such as Ag or Al. According to the general scope of the invention, the reflector 103 reflects and scatters light incident on the reflector, essentially no matter what angle of incidence the light has on the reflector.

Light emitted by the LED 101 is emitted having at least a component of the light directed towards the reflector 103, and upon encountering the reflector, the light is reflected back into the light propagation region, however, after this reflection being scattered, i.e. having a significantly higher angular spread, and having a significant deviation of light propagation from the incident light direction. Typically the angular spread after reflection in the reflector 103 is close to a half sphere spread. Due to this high spread, there is a good chance that light eventually will exit the device through the lateral openings 114. Scattering redistribution could also occur in the waveguiding layer, for example by having some scattering particles or pores therein.

The degree of reflection in the reflector is typically in the range of R> about 90%, such as R> about 95%.

Hence, the transmission of light through the top surface of the reflector is very low, typically below 10%.

The reflector 103 in the embodiment in FIG. 1 will be described more in detail below.

The LED 101 emits light into the region between the substrate 102 and the reflector 103. This region is herein denoted as the light propagation region 115. A purpose of this light propagation region 115 is to lead the light from the LED 101 to the lateral openings 114. In this light propagation region, light is reflected back and forth between the reflective surfaces and will eventually exit the device through the lateral openings 114.

The light propagation region is preferably essentially transparent to light of the wavelengths emitted by the LED(s) of the device, such as not to absorb light in an appreciable extent.

The light propagation region 115 may be an open void, filled with any gas, such as e.g. air, or alternatively vacuum, or may be of a liquid, gel or solid material. Examples of solid materials suitable for use in a solid body light propagation region 115 include, but are not limited to solid inorganic materials, such as alumina, glass, fused silica, sapphire, and YAG, and silicones, fluoropolymers, polyolefines or other polymers. The solid body light propagation region 115 may further comprise an additional amount of scattering material to obtain a homogenous light distribution in the region. In embodiments of the present invention, the solid body light propagation region 115 may, but does not necessarily, comprise wavelength converting material 107 arranged, such as distributed in the light propagation region 115, or may be formed from a wavelength converting material. Hence, a significant portion of the light exiting the light propagation region 115 will have been subject to the wavelength converting material 107.

The wavelength converting material 107 is a material which upon absorption of light of a certain wavelength or wavelength range, emits light of a different, converted, wavelength or wavelength range. Typically, the converted wavelengths are shifted towards longer wavelengths. Conventionally, such materials are typically fluorescent and/or phosphorescent. Many such wavelength converting materials are known to those skilled in the art, and one commonly used group of compound goes under the name "phosphors".

The wavelength converting material may for example be ceramic, solid materials or embedded in a binder material, such as a carrier polymer. The wavelength converting material may be directly disposed on the LED surface or bonded with an adhesive layer to the LED surface.

The wavelength converting material 107 is matched to the LED 101 such that it absorbs at least part of the light emitted by the LED. Hence, the selection of wavelength converting material depends on the selection of LED. For example, the wavelength converting material may partly convert blue light into green/yellow light, which mixes into white light. However, other wavelength converting materials may be used as well, for example fully converting blue into green, yellow or red, or converting UV-light into visible light.

The reflector 103 schematically illustrated in FIG. 1 will now be discussed further in detail.

In operation, the LED 101 dissipates heat, and therefore also the reflector is subjected to heat. Hence, the reflector 103 must withstand elevated temperatures for extended time period with maintained optical properties. Furthermore, when the LED 101 emits UV or blue light, the reflector must withstand UV or blue light exposure for extended time periods with maintained optical properties.

The scattering reflector 103 comprises carrier material in which light scattering components 110 are distributed.

Scattering is achieved by have a refractive index difference between one phase and a surrounding phase in which the size of the dispersed phase is in the order of the wavelength of light for the scattering to be effective. Such a system can e.g. be high index dispersed particles or low index pores in a carrier.

In this embodiment, the reflector 103 comprises a carrier 108 of a silicate network and optionally silica particles, and scattering particles 110 dispersed therein. The scattering particles 110 is made of a material, typically a metal oxide, having a refractive index which exceeds the refractive index of the carrier.

A silicate network has the advantages of being thermally stable and photo stable. Hence, silicate networks are well suited as carrier material for the scattering reflector of the present invention.

A typical composition for a scattering reflector of the present invention consists of a prehydrolysed sol of an alkoxysilane and/or alkyl alkoxysilane (e.g. methyltrimethoxysilane (MTMS)) in acidified water. Examples of alkoxysilanes include tetramethoxysilane or tetraethoxysilane. Examples of alkyl alkoxysilanes include methyltrimethoxysilane (MTMS), methyltriethoxysilane (MTES) or phenyltrimethoxysilane, phenyltriethoxysilane or dimethyldimethoxysilane. Optionally a suspension of silica nanoparticles is added to this sol to improve mechanical properties and reduce shrinkage during curing of the layer. Subsequently oxide particles with high index of refraction, having a submicronic range particle size distribution are added to the sol. The resulted suspension is stable and can be used for at least 2 months if stored in a freezer. At room temperature the suspension slowly reacts in which the hydrolysed alkoxysilane or alkylalkoxy monomers react to form a rigid inorganic network. The reaction is accelerated during coating procedures when the solvent (typically water, or water/alcohol mixture) is removed. After coating the layer is thermally cured to accelerate network formation. When alkoxysilanes are used as carrier material, silicate networks are formed with incorporated scattering pigments and optional nano-particles. When alkyl alkoxysilanes are used, an alkylsilicate network is formed, such as a methylsilicate network when methyltrimethoxysilane is used.

Another type of composition uses already prepolymerised commercial silane precursor (e.g. Silres—Wacker Chemie) which are readily solved in organic solvents and a stable suspension is obtained by adding oxide particles with high index of refraction in submicronic particle size range.

Yet another type of carrier/binder material consists of siloxanes, such as silicone materials. A solvent might be added to reduce viscosity, but undissolved siloxanes might be used as well. Scattering particles are added to the siloxane or dissolved siloxane to obtain a coatable dispersion.

Examples of scattering particles include particles of metal oxides, such as $TiO_2$ rutile (n=2.7), $TiO_2$ anatase (n=2.4), $ZrO_2$ (n=2.1), $Ta_2O_5$ (n=2.2), $Nb_2O_5$ (n=2.2), $SnO_2$ (n=1.89), $Al_2O_3$ (n=1.76), or another inorganic material, such as for example ZnS (n=2.3). The layer thickness needed to obtain the same value of reflectivity at the same volume content of oxide decreases with increasing the value of refractive index at a similar particles size distribution. Typically, for appropriate optical properties, the mean particle size of the scattering particles is below about 1 µm but exceeds 50 nm.

Typically scattering particles constitutes from 10 to 70% by volume of said reflector.

Yet another type of scattering reflector utilizes a ceramic material as carrier. Typically, the ceramic carrier contains pores with a pore size in the order of the wavelength of light. The concentration of pores is typically between 10 and 70 volume percent. The ceramic binder material typically consists of yttriumaluminiumgarnet (YAG), alumina ($Al_2O_3$), zirconia ($ZrO_2$) or titania ($TiO_2$), but other ceramic materials may be used as known to those skilled in the art. The pores typically consist of air filled voids. The ceramic materials are typically processed from powders that are pressed a flat substrate combined with a polymeric binder. In this process air pockets are intrinsically introduced. The substrates can also be produced using slipcasting or tape casting techniques known to those skilled-in-the-art. The substrates are sintered to remove the binder and obtain a densified, cohesive layer at elevated temperature. The amount and size of remaining air pockets is controlled with sintering time, temperature and sintering gas. These ceramic reflectors are typically bonded to the light propagating layer 106 with an adhesive. A ceramic porous reflector is highly photo-thermally stable as it consists of inorganic materials solutions that are processed at temperatures that by far exceed the operating temperatures of the LED, which is typically between 150 and 200° C.

The main portion of the light emitted by the LED will be reflected back into the light propagation region 115 due to the scattering, but a fraction of the light will also pass the reflector 103 essentially unscattered, or scattered but still with a forward direction.

In a first alternative, this residual light, passing through the scattering reflector 103 is blocked. This may for example be made by arranging an essentially opaque top reflector 109 on the scattering reflector 103. Light encountering the top reflector 109 will be reflected back into the scattering reflector 103, and eventually into the light propagation region 115 for transmission towards the lateral exit openings 114. The light hence has two opportunities to become scattered, increasing the scattering efficiency. Hence, the thickness of the scattering reflector or the concentration of scattering particles may be reduced, still obtaining the desired scattering and redistribution effects in combination with the top reflector.

The top reflector may typically be of a metal layer, such as of silver or aluminum, or may be a dichroic mirror. The metal layer reflector is typically thin, about 100 to 500 nm in comparison to the scattering reflector, which may have a thickness in the range of from 10 to 100 µm, such as 30 to 50 µm. A dichroic mirror typically has an angular range of very high reflectance, such as 99% but is likely to have an angular dependence to give reduced reflectances at significantly deviating angles. The reflectance is also likely to be spectrally dependent.

The top reflector is typically a specular reflector for minimized reflection losses, but may in some applications be a diffuse reflector such as a diffuse reflector similar to the scattering reflector.

When the top reflector is a diffuse reflector, the top reflector may be a scattering reflector that uses a pigment with a higher scattering power than the scattering reflector. The light incident from the light conversion layer 107 is then scattered by the scattering reflector and partially reflected back and partially transmitted to the top reflector. The advantage is that related to the fact that pigments with a lower scattering power, such as anatase have an absorption band at lower wavelengths than rutile which has a very high scattering power. Therefore, anatase does not substantially absorb light at a wavelength higher than 400 nm but rutile has an absorption edge that results in absorption losses below 425 nm. Blue LED may contain a light emission between 400 and 425 nm that would be partly absorbed by a rutile containing reflector. The anatase containing reflector will therefore reflect a substantial part of the light between 400 and 425 nm without absorption loss whereas the top reflector containing rutile pigment shows a higher reflectance at wavelengths exceeding 425 nm. Similarly, if the LED emits UV light, the scattering reflector layer may contain an alumina or zirconia pigment that has no UV absorption in the near UV, combined with a higher scattering power rutile pigment or anatase pigment to increase the reflectivities for the converted visible light wavelengths by the wavelength conversion layer.

In a second alternative, the residual light can be used for illuminating the top surface of the light emitting diode. In certain applications, it may be advantageous that the position of the light emitting diode is easily detectable from above. It can also give a pleasant appearance to the diode.

A small amount of pigment could be added to or on top of the reflective layer. The pigment preferably is a typical inorganic pigment (such as, but not limited to $Cr_2O_3$, $CoAl_2O_4$, etc.) depending on the desired color, or could be a luminescent pigment. The pigment typically is incorporated in a binder, such as a silicone or a silane network as described above.

The pigment can be added to the reflector formulations or may be applied on top of the scattering reflector as a coating, optionally formulated in a scattering coating formulation.

The colored appearance of the side-emitter LED is very attractive to adjust the appearance of the LED to the application and design of the device the LED is used in. This is especially the case for flash LEDs, such as used in mobile phones. A side-emitter LED in combination with a reflector around the LED, such as a parabolic reflector, can be used as flash light. The top surface of the reflector is however seen in the application. A colored, photo-thermally stable, surface coating is hence desired to match the design of the device. As the colored coating can be substantially blocked from direct LED light by the reflector coating (only a minor amount of light escapes through the top surface of the scattering reflector), it does not interfere with the side-emitter operation.

On the other hand, residual or deliberate light leakage through the scattering reflector, which light interacts with the colored or luminescent pigment on top can add colored light to the light emitted from the side-faces. In the application this light can be mixed in order to adjust the overall color of the illumination.

The person skilled in the art realizes that the present invention by no means is limited to the preferred embodiments described above. On the contrary, many modifications and variations are possible within the scope of the appended claims. For example, in the drawings, the substrate and the reflector are illustrated as having the same footprint size. However, it is possible that one of the substrate and the reflector has a larger footprint than the other.

Further, in a side emitting device of the present invention, it is not necessary that the lateral openings 114, through which light exits the device, goes around the full circumference of the device.

In some embodiments of the invention, a portion of the lateral edges of the light propagation region may be covered, such that no light can exit the device in that direction. For example, in a square device, the lateral edges on one or more sides of the square may be covered, so that light only escapes via the non-covered sides. Preferably, the covered sides are covered with a reflective coating 113 so that at least some of the light encountering a covered side face is reflected back into the light propagation region. More preferably, the reflective coating is of the same material as is used as the scattering reflector 103. To summarize, a side-emitting light emitting device is provided, comprising at least one light emitting diode arranged on a substrate and facing a scattering reflector disposed at a distance from and extending along the extension of said substrate. The scattering reflector comprises scattering components distributed in a carrier, and the scattering components has a refractive index being different from the refractive index of said carrier.

The scattering action of the reflector gives rise to an angular redistribution in the device, which increases the chance of light exiting the device through lateral openings between the reflector and the substrate, while light is essentially prevented from being emitted through the top surface. A light emitting device of the present invention may for example be used within the areas of LED-illumination, for example for back light application in display devices, in light guide applications, including flat light guide luminaries, LED collimator configurations, such as can be used for automotive head lighting or general LED-spot lighting. The areas of use are however not limited to the above.

The invention claimed is:

1. A side-emitting light emitting device, comprising at least one light emitting diode arranged on a substrate and facing a scattering reflector disposed at a distance from and extending along an extension of said substrate,
   wherein said scattering reflector comprises scattering components distributed in a carrier, the scattering components having a refractive index different from the refractive index of said carrier, said scattering components comprising a plurality of pores having a refractive index lower than the refractive index of said carrier.

2. A light emitting device according to claim 1, wherein said scattering components constitute from 10 to 70% by volume of said scattering reflector.

3. A light emitting device according to claim 1, wherein said carrier comprises a silicon-comprising network.

4. A light emitting device according to claim 3, wherein said silicon-comprising network is a silicate network or a polysiloxane network.

5. A light emitting device according to claim 1, wherein said carrier comprises a ceramic material.

6. A light emitting device according to claim 1, wherein said scattering reflector has a reflectivity of above 90%.

7. A light emitting device according to claim 1, wherein a top reflector is arranged on top of said scattering reflector.

8. A light emitting device according to claim 1, wherein a solid transmissive material is arranged between said substrate and said scattering reflector.

9. A light emitting device according to claim 1 wherein said solid transmissive material comprises a wavelength converting material.

10. A light emitting device according to claim 1, wherein said scattering reflector comprises a pigment.

11. A light emitting device according to claim 1, wherein said scattering reflector is arranged parallel to said substrate.

12. A light emitting device according to claim 1, wherein part of the lateral edges of said solid transmissive material is coated by a reflective coating.

\* \* \* \* \*